United States Patent
Ibok et al.

(10) Patent No.: US 6,762,454 B1
(45) Date of Patent: Jul. 13, 2004

(54) STACKED POLYSILICON LAYER FOR BORON PENETRATION INHIBITION

(75) Inventors: Effiong Ibok, Sunnyvale, CA (US); Joong S. Jeon, Cupertino, CA (US); Arvind Halliyal, Cupertino, CA (US); Minh Van Ngo, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/118,363

(22) Filed: Apr. 8, 2002

(51) Int. Cl.[7] .................. H01L 29/76; H01L 29/788; H01L 29/792
(52) U.S. Cl. .................. 257/324; 257/288; 257/314; 257/315; 257/316; 257/321; 257/324; 257/325
(58) Field of Search ................ 257/332, 288, 257/314, 315, 316, 317, 321, 325, 324

(56) References Cited

U.S. PATENT DOCUMENTS

| | | | |
|---|---|---|---|
| 5,567,638 A | * 10/1996 | Lin et al. | 438/592 |
| 6,013,553 A | 1/2000 | Wallace et al. | 438/287 |
| 6,020,024 A | 2/2000 | Maiti et al. | 427/248.1 |
| 6,051,865 A | 4/2000 | Gardner et al. | 257/411 |
| 6,153,470 A | * 11/2000 | He et al. | 438/257 |
| 6,210,999 B1 | * 4/2001 | Gardner et al. | 438/183 |
| 6,455,372 B1 | * 9/2002 | Weimer | 438/257 |

* cited by examiner

*Primary Examiner*—Nathan J. Flynn
*Assistant Examiner*—Victor A. Mandala, Jr.
(74) *Attorney, Agent, or Firm*—Renner, Otto, Boissele & Sklar, LLP

(57) ABSTRACT

A semiconductor device formed on a semiconductor substrate having an active region and a method of making the same is disclosed. The semiconductor device includes a stacked polysilicon layer formed on a dielectric layer. The stacked polysilicon layer inhibits the diffusion of boron in the dielectric layer and the penetration of boron into the dielectric layer and the semiconductor substrate.

19 Claims, 1 Drawing Sheet

STACKED POLYSILICON LAYER FOR BORON PENETRATION INHIBITION

TECHNICAL FIELD

The present invention generally relates to semiconductor devices having a dielectric layer of a high-K material. In particular, the present invention relates to a stacked polysilicon layer for boron penetration inhibition.

BACKGROUND

A conventional field effect transistor (FET) is characterized by a vertical stack on a semiconductor substrate. The semiconductor substrate is doped with either n-type or p-type impurities to form an active region in the semiconductor substrate. The vertical stack includes a gate dielectric and a gate electrode. The gate dielectric of silicon dioxide ($SiO_2$ gate dielectric), for example, is formed on the semiconductor substrate. The gate electrode of polysilicon, for example, is formed on the gate dielectric. The gate electrode formed on the $SiO_2$ gate dielectric defines a channel interposed between a source and a drain formed within the active region of the semiconductor substrate. The source and the drain are formed by dopant impurities introduced into the semiconductor substrate.

A pervasive trend in modem integrated circuit manufacture is to produce semiconductor devices, e.g., FETs, having feature sizes as small as possible. Many present processes employ features, such as gate electrodes and interconnects, which have less than a 0.18 µm critical dimension. As feature sizes continue to decrease, the size of the resulting semiconductor device, as well as the interconnect between semiconductor devices, also decreases. Fabrication of smaller semiconductor devices allows more semiconductor devices to be placed on a single monolithic semiconductor substrate, thereby allowing relatively large circuit systems to be incorporated on a single, relatively small die area.

As semiconductor device feature sizes decrease, the thickness of the $SiO_2$ gate dielectric decreases as well. This decrease in $SiO_2$ gate dielectric thickness is driven in part by the demands of overall device scaling. As gate electrode widths decrease, for example, other device dimensions must also decrease in order to maintain proper device operation. Early semiconductor device scaling techniques involved decreasing all dimensions and voltages by a constant scaling factor, to maintain constant electric fields in the device as the feature size decreased. This approach has given way to more flexible scaling guidelines which account for operating characteristics of short-channel devices. A maximum value of semiconductor device subthreshold current can be maintained while feature sizes shrink. Any or all of several quantities may be decreased by appropriate amounts including $SiO_2$ gate dielectric thickness, operating voltage, depletion width and junction depth, for example.

As a result of the continuing decrease in feature size, $SiO_2$ gate dielectric thickness has been reduced so much that $SiO_2$ layers of $SiO_2$ gate dielectrics are approaching thicknesses on the order of ten angstroms (Å) (1 nm). Unfortunately, a thin $SiO_2$ layer may break down when subjected to an electric field, particularly the $SiO_2$ layer less than 50 angstroms (Å) (5 nm) thick. It is probable that even for a relatively low gate voltage of 3V, electrons can pass through the thin $SiO_2$ layer by a quantum mechanical tunneling effect. In this manner, a leakage current may undesirably form between the gate electrode and the semiconductor substrate, adversely affecting the operability of the device. Leakage current increases exponentially for a two-fold decrease in $SiO_2$ layer thickness. The exponential increase in the $SiO_2$ layer leakage current significantly affects the operation of semiconductor devices, particularly with regard to standby power, dissipation, reliability and lifetime.

One proposed solution is to replace the $SiO_2$ material of the gate dielectric with a material having a dielectric constant value higher than $SiO_2$ (high-K dielectric material will be further explained below). Using a dielectric material having a high-K for the gate dielectric would allow a higher capacitance and an electric equivalent thickness of a thinner $SiO_2$ gate dielectric to be achieved while maintaining or increasing the physical thickness of the gate dielectric. For example, an aluminum oxide ($Al_2O_3$) layer with a K of 9.6 and a physical thickness of 62.5 angstroms (Å) (6.25 nm) is substantially electrically equivalent to a $SiO_2$ layer (K=3.9) having a physical thickness of 25 angstroms (Å) (2.5 nm). Thus, the gate dielectric of $Al_2O_3$ would have an electrical equivalent thickness of 25 angstroms (Å) (2.5 nm) of $SiO_2$, but have a physical thickness of 62.5 angstroms (Å) (6.25 nm). Therefore, the gate dielectric can be made electrically thin while being formed of a physically thicker layer. Alternatively, the electric equivalent thickness may be further reduced by reducing the physical thickness of the high-K dielectric material as should be understood by those skilled in the art. As a result, further device scaling can be achieved.

However, with the use of boron as a dopant for P+ gates, dopant diffusion and its subsequent penetration into the high-K gate dielectric may become a problem. It is known by those skilled in the art that the penetration of the boron into the $SiO_2$ gate dielectric causes a number of problems not only with the quality of the dielectric layer, but especially with the device operation. Boron penetration shifts the threshold voltage of MOS devices to more positive values. The degradation of the MOSFET transconductance and a subthreshold slope is also correlated with boron penetration.

Typically boron is implanted into the polysilicon gate using sufficiently high doses to ensure reasonable conductance of the polysilicon gate. Unfortunately, it is also necessary to activate the dopant with a high-temperature anneal, typically in the range of 950 to 1050° C. in an inert ambient for a few seconds. Boron is an extremely small atom, and as such has a very high diffusion coefficient in both silicon and gate dielectric materials (e.g., $SiO_2$ and high-K dielectric materials) at such elevated temperatures. During the high-temperature activation annealing, the boron penetrates into and through the gate dielectric. Further with increasing time, significant diffusion of boron occurs, resulting in a build-up of boron at the polysilicon/dielectric interface. Further still, the boron may move from the polysilicon gate into the gate dielectric and into the crystalline silicon substrate. Additionally with increasing time, the boron in the bulk of the polysilicon decreases, while the boron at the polysilicon/dielectric interface increases.

As the boron penetrates into the dielectric layer, a number of measurable effects can be noted. The capacitance-voltage (C-V) curves of a semiconductor device may shift to higher, more positive values as the annealing time is increased. This C-V or flat-band voltage shift (delta $V_{FB}$) which is similar in magnitude to delta $V_T$ of the MOSFET, degrades device performance.

Boron penetration also effects the quality of the dielectric layer. The yield of devices decreases with increasing boron penetration, which is coincident with increases in delta $V_{FB}$. The yield represents the number of good devices, as measured by their current-voltage characteristics. The reduction in yield resulting from boron penetration could become a substantial impediment to the manufacture of C-MOS devices.

Therefore, there exists a strong need in the art for a device structure which will inhibit boron penetration of a dielectric layer and/or the semiconductor substrate. Thus, the properties of the dielectric layer can be preserved.

SUMMARY OF THE INVENTION

A stacked polysilicon layer may be formed on a high-K gate dielectric of a semiconductor device. The stacked polysilicon layer would include an interface layer. The interface layer would include at least one layer of an oxide material or a nitride rich material. The interface layer may be interposed between a thin polysilicon layer and a thick polysilicon layer. The thin polysilicon layer may be formed on the high-K gate dielectric. The interface layer will inhibit boron penetration of the high-K dielectric layer and/or the semiconductor substrate. Thus, the effective capacitance of the high-K gate dielectric will not be reduced by the penetration of boron. Further, the effective electrical thickness of the high-K gate dielectric will not be decreased. Additionally, the leakage current through the high-K gate dielectric will not be substantially affected. Furthermore, the operability of the semiconductor device can be improved through further device scaling using high-K materials for gate dielectrics resulting in smaller, faster, more reliable devices.

According to one aspect of the invention, the invention is a semiconductor device formed on a semiconductor substrate having an active region. The semiconductor device includes a stacked polysilicon layer formed on a dielectric layer. The stacked polysilicon layer inhibits the diffusion of boron in the dielectric layer and the penetration of boron into the dielectric layer and the semiconductor substrate.

According to one aspect of the invention, the invention is a semiconductor device formed on a semiconductor substrate having an active region. The semiconductor device includes a gate dielectric layer disposed on the semiconductor substrate. A thin polysilicon layer is disposed on the gate dielectric layer. An interface layer is disposed on the thin polysilicon layer. A gate electrode is formed on the interface layer. The gate electrode defines a channel interposed between a source and a drain formed within the active region of the semiconductor substrate. The interface layer inhibits the boron diffusion and penetration of the gate dielectric layer.

According to another aspect of the invention, the invention is a method of fabricating a semiconductor device formed on a semiconductor substrate having an active region. The method includes the step of forming a gate dielectric layer on the semiconductor substrate. Further, the method includes the step of forming a thin polysilicon layer on the gate dielectric layer. Further still, the method includes the step of forming an interface layer on the thin polysilicon layer. The method further includes the step of forming a source and a drain within the active region of the semiconductor substrate. Additionally, the method includes the step of forming a gate electrode on the interface. The gate electrode defines a channel interposed between the source and the drain. The interface layer inhibits the boron diffusion and penetration of the gate dielectric layer.

DETAILED DESCRIPTION

Figure 1:
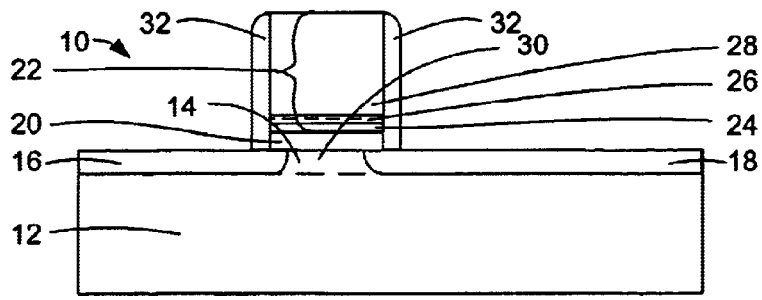
FIG. 1 is a schematic cross-sectional view of a semiconductor device including a stacked polysilicon layer in accordance with the present invention.

To illustrate the present intention in a clear and concise manner, the drawings may not necessarily be to scale and certain features may be shown in somewhat schematic form.

The present invention is described hereinbelow in terms of a common semiconductor device formed on a semiconductor substrate. Specifically, a field effect transistor (FET) formed on a semiconductor substrate is described. However, the present invention is not limited to this illustrative embodiment. The present invention may be applied to any semiconductor device in which a high-K dielectric layer is used. For example, the present invention may be used with a gate dielectric in a FLASH memory cell. Alternatively, the present invention may be used with an intergate dielectric layer in a gate electrode EEPROM FLASH memory device. In another embodiment, the present invention may be used with an ONO layer in a SONOS-type FLASH memory device, such as the Mirror-Bit™ SONOS-type FLASH memory device available from AMD. Thus, it is to be understood that the present invention is not limited to the specific illustrative embodiments described below.

The present invention relates to a semiconductor device and to a method of making the semiconductor device. The semiconductor device includes a stacked polysilicon layer formed on a gate dielectric. The stacked polysilicon layer includes at least one interface layer interposed between a thin polysilicon layer and a thick polysilicon layer. In an exemplary embodiment, the interface layer is an oxide layer. In another exemplary embodiment, the interface layer is a nitrogen rich layer. It should be understood by those skilled in the art that the interface layer may be of any material compatible with semiconductor processing which inhibits the boron penetration of the gate dielectric and/or the semiconductor substrate. Further, it should be understood by those skilled in the art that boron diffusion and penetration of the gate dielectric may not be completely prevented. However, the boron that diffuses or penetrates is reduced and thus will not significantly affect the operation of the semiconductor device.

Thus, in an exemplary embodiment the present invention relates to a semiconductor device having a stacked polysilicon layer. The semiconductor device includes a semiconductor substrate and a FET formed thereon. The FET is characterized by a vertical stack. The vertical stack includes a gate dielectric and the stacked polysilicon layer. The stacked polysilicon layer includes an interface layer. The gate dielectric is formed on the semiconductor substrate. The stacked polysilicon layer is formed on the gate dielectric. Specifically, a thin polysilicon layer is formed on the gate dielectric. The interface layer is formed on the thin polysilicon layer. A gate electrode is formed on the interface layer. The interface layer includes at least one sub-layer of an oxide or a nitrogen rich material, for example. The interface layer inhibits the boron diffusion and/or penetration of the high-K gate dielectric and/or the semiconductor substrate during the processing of the semiconductor device. Thus, the stacked polysilicon layer preserves the high-K properties of the high-K dielectric layer(s) in semiconductor devices.

FIG. 1 shows a semiconductor device of the present invention generally designated as 10. The semiconductor device 10 comprises a semiconductor substrate 12 having an active region 14. The active region 14 may have a thickness of between 800 and 1000 angstroms (Å) (80 and 100 nm). A source 16 and a drain 18 are formed in the active region 14. A gate dielectric 20 is formed on the semiconductor 14. A stacked polysilicon layer 22 is formed on the gate dielectric 20. The stacked polysilicon layer 22 is formed of a thin polysilicon layer 24, an interface layer 26, and a thick polysilicon layer 28 (i.e., may also be hereinafter referred to as gate electrode 28). The thin polysilicon layer 24 is formed on the gate dielectric 20. The interface layer 26 is formed on the thin polysilicon layer 24. The gate electrode 28 is formed on the interface layer 26. The gate electrode 28 defines a channel 30 between the source 16 and the drain 18. The gate dielectric 20, the thin polysilicon layer 24, the interface layer 26 and the gate electrode 28 form a vertical stack characteristic of a FET. Spacers 32 may be formed on the sidewalls of the vertical stack and an upper surface of the semiconductor substrate 12. The interface layer 26 is formed of an oxide or a nitrogen rich material, for example. Isolation techniques that are known in the art may be used to electrically isolate the semiconductor device 10 from other semiconductor devices (not shown).

In one embodiment, the semiconductor substrate 12 is a bulk silicon semiconductor substrate. In one embodiment, the semiconductor substrate 12 is a silicon-on-insulator semiconductor substrate. In another embodiment, the semiconductor substrate 12 is a p-doped silicon semiconductor substrate. Suitable semiconductor substrates include, for example, bulk silicon semiconductor substrates, silicon-on-insulator (SOI) semiconductor substrates, silicon-on-sapphire (SOS) semiconductor substrates, and semiconductor substrates formed of other materials known in the art. The present invention is not limited to any particular type of semiconductor substrate.

The active region 14 may be a p-type region or an n-type region formed in the semiconductor substrate 12. The active region 14 may be predoped prior to the manufacture of the gate electrode 28 of the semiconductor device 10. The active region 14 may be doped with p-type dopings for n-type channel devices and/or n-type dopings for p-type channel devices.

The source 16 and the drain 18 may be two N+ regions formed in the active region 14 of the semiconductor substrate 12. Alternatively, the source 16 and the drain 18 may be two P+ regions. In the exemplary embodiment illustrated in FIG. 1, the source 16 and the drain 18 are shown as respective deep implant regions. However, it should be understood that shallow extension regions could also be formed extending from the respective deep implant regions.

The gate dielectric 20 interposed between the thin polysilicon layer 24 and the semiconductor substrate 12 is shown as a single layer dielectric. However, the gate dielectric 20 could be a multi-layer dielectric. The gate dielectric 20 may be made of suitable gate dielectric materials having a dielectric constant greater than $SiO_2$ (K=3.9) as will be further discussed below. In this exemplary embodiment, the gate dielectric 20 is made of $Al_2O_3$. The gate dielectric 20 may have a thickness of between 50 and 100 angstroms (Å) (5 and 10 nm), for example.

The thin polysilicon layer 24 is interposed between the gate dielectric 20 and the interface layer 26. The thin polysilicon layer 24 may have a thickness of between 10 and 200 angstroms (Å) (1 and 20 nm).

The interface layer 26 may be made of an oxide material or a nitrogen rich material. Examples of the nitrogen rich material may include $Si_xN_y$ or $SiO_xN_y$. The interface layer 26 may have a thickness of between 3 and 50 angstroms (Å) (0.3 and 5 nm), for example. Although the interface layer 26 is shown as a single layer, it should be understood that the interface layer 26 may have more layers. In one embodiment, the interface layer 26 may have at least two layers of at least one of a first nitrogen rich material and one of a second nitrogen rich material. In one embodiment, the interface layer a $Si_xN_y$ layer and a $SiO_xN_y$ layer.

The gate electrode 28 may be made of typical, well-known gate electrode materials, for example, polysilicon. The exemplary gate electrode 28 may have a thickness of between 300 and 1100 angstroms (Å) (30 and 110 nm).

The channel 30 may be a p-type region interposed between the source 16 and the drain 18. Alternatively, an n-type channel could be interposed between two P+ regions.

The spacers 32 are made of a dielectric material. The dielectric material may be $Si_xN_y$, $SiO_xN_y$, $Al_2O_3$, or may be made of another high-K dielectric material described below. The exemplary spacers 32 may have total heights between 500 and 1500 angstroms (Å) (50 and 150 nm). Further, the spacers 32 are shown as single layer spacers. However, the spacers 32 could be multi-layer spacers.

Not shown in FIG. 1 are additional parts of a working semiconductor device such as electrical conductors, protective coatings and other parts of the structure which would be included in a complete, working semiconductor device. These additional parts are not necessary to the present invention, and for simplicity and brevity are neither shown nor described. Nevertheless, how such parts could be added will be easily understood by those of skill in the art.

As used herein, the term "high-K dielectric" refers to a dielectric material having a K greater than $SiO_2$(K=3.9). Such high-K dielectric materials include, for example, silicon oxynitride ($SiO_xN_y$), which has a K of about 4–8 depending on the relative content of oxygen and nitrogen; silicon nitride ($Si_xN_y$), which has a K of about 6–9; aluminum oxide ($Al_2O_3$), which has a K of about 10; composite materials such as hafnium silicate, which has a K of about 14; hafnium silicon oxynitride, which has a K of about 16, depending on the relative content of oxygen and nitrogen; hafnium silicon nitride, which has a K of about 18; $HfO_2$, $ZrO_2$, $Ta_2O_5$ and others, some of which are identified more fully below.

Approximate K-values or, in some cases, a range of K-values, are shown below in Table 1 for several exemplary dielectric materials. It is understood that the present invention is not limited to the specific dielectric materials disclosed herein, but may include any appropriate dielectric materials which are known and are compatible with the remaining elements of the semiconductor device with which the dielectric materials are to be used.

TABLE 1

| Dielectric Material | Approximate Dielectric Constant (K) (Relative Permittivity) |
| --- | --- |
| silicon nitride, $Si_xN_y$ | 6–9 |
| silicon oxynitride, $SiO_xN_y$ | 4–8 |
| aluminum oxide | 10 |
| zirconium silicate | 12 |
| hafnium silicate | 15 |
| lanthanum oxide, $La_2O_3$ | 20–30 |
| hafnium oxide, $HfO_2$ | 40 |
| zirconium oxide, $ZrO_2$ | 25 |
| cerium oxide, $CeO_2$ | 26 |
| bismuth silicon oxide, $Bi_4Si_2O_{12}$ | 35–75 |
| titanium dioxide, $TiO_2$ | 30 |
| tantalum oxide, $Ta_2O_5$ | 26 |
| tungsten oxide, $WO_3$ | 42 |
| yttrium oxide, $Y_2O_3$ | 20 |
| $LaAlO_3$ | 25 |
| BST ($Ba_{1-x}Sr_xTiO_3$) | ~20—~200 |
| $PbTiO_3$ | ~20—~200 |
| $BaTiO_3$ | ~20—~200 |
| $SiTiO_3$ | ~20—~200 |
| $PbZrO_3$ | ~20—~200 |
| PST ($PbSc_xTa_{1-x}O_3$) | ~200—3000 |
| PZN ($PbZn_xNb_{1-x}O_3$) | ~200—5000 |
| PZT ($PbZr_xTi_{1-x}O_3$) | ~100—1000 |
| PMN ($PbMg_xNb_{1-x}O_3$) | ~200—5000 |

It is noted that the K-values, or relative permittivity, for dielectric materials may vary to some degree depending on the exact nature of the dielectric material and on the process used to deposit the material. Thus, for example, differences in purity, crystallinity and stoichiometry, may give rise to variations in the exact K-value determined for any particular dielectric material.

As used herein, when a material is referred to by a specific chemical name or formula, the material may include non-stoichiometric variations of the stoichiometrically exact formula identified by the chemical name. For example, tantalum oxide, when stoichiometrically exact, has the chemical formula $Ta_2O_5$. As used herein, the term "tantalum oxide" may include variants of stoichiometric $Ta_2O_5$, which may be referred to as $Ta_xO_y$, in which either of x or y vary by a small amount. For example, in one embodiment, x may vary from about 1.5 to about 2.5, and y may vary from about 4.5 to about 5.5. In another embodiment, x may vary from about 1.75 to about 2.25, and y may vary from about 4.0 to about 6.0. Such variations from the exact stoichiometric formula fall within the definition of tantalum oxide. Similar variations from exact stoichiometry are included when the chemical formula for a compound is used. For example, again using tantalum oxide as an example, when the formula $Ta_2O_5$ is used, $Ta_xO_y$ as defined above, is included within the meaning. Thus, in the present disclosure, exact stoichiometry is intended only when such is explicitly so stated. As will be understood by those of skill in the art, such variations may occur naturally, or may be sought and controlled by selection and control of the conditions under which materials are formed.

Here and in all numerical values in the specification and claims, the limits of the ranges and ratios may be combined.

The present invention further relates to a method of making the above-described semiconductor device 10. First, the semiconductor substrate 12, including the active region 14, is provided. Next, the gate dielectric layer 20 is deposited on the semiconductor substrate 12. Following the deposition of the gate dielectric layer 20, the stacked polysilicon layer 22 including the thin polysilicon layer 24, the interface layer 28 and the gate electrode layer 28 is formed on the gate dielectric layer 20. Specifically, the thin polysilicon layer 24 is deposited on the gate dielectric layer 20. Then, the interface layer 26 is deposited on the thin polysilicon layer 24. Next, the gate electrode layer 28 is deposited on the interface layer 26. Next, a pattern is formed on the gate electrode layer 28. Then, an etch is done to form a gate. Together, the gate dielectric 20, the thin polysilicon layer 24, the interface layer 26 and the gate electrode 28 form a vertical stack on the semiconductor substrate 12 characteristic of a FET. Next, the semiconductor substrate 12 is doped to form the source 16 and the drain 18. Afterwards, the spacer layer 32 of dielectric material is deposited on the vertical stack and the semiconductor substrate 12. Next, the spacer layer 32 is anisotropically etched to form spacers 32 on the sidewalls of the vertical stack. The semiconductor device 10 is then subjected to a rapid thermal annealing (RTA) process in order to activate the dopants. The stacked polysilicon layer 22 inhibits the boron diffusion and/or penetration of the high-K gate dielectric material and/or the semiconductor substrate 12 during the doping step and the subsequent RTA step.

In one embodiment, the interface layer 26 is deposited by chemical vapor deposition (CVD). The CVD method may be any appropriate CVD method known in the art. For example, the CVD method may be PECVD, RTCVD or LPCVD. In one embodiment, the interface layer 26 is deposited by atomic layer deposition (ALD). In one embodiment, the interface layer 26 is thermally grown. In one embodiment, the oxide layer may be grown using oxygen in a standard thermal diffusion furnace. In one embodiment, the nitrogen rich material is deposited by a nitridation method. In one embodiment, the nitridation is done in an RTP. In one embodiment, the nitrogen rich materials are deposited in the same apparatus. In one embodiment, the nitrogen rich materials are deposited sequentially by controlling the supply of precursor materials to the CVD apparatus.

In an alternative embodiment, multiple layers may be deposited one at a time, in separate apparatuses. This alternative embodiment allows for different deposition methods to be used for the respective layers.

The method of making the semiconductor device 10 having the stacked polysilicon layer 22 is now described in detail with reference to FIGS. 2–6. FIG. 6 is a flow diagram 50 schematically presenting the steps of making the semiconductor device 10 of the present invention.

Figure 2:
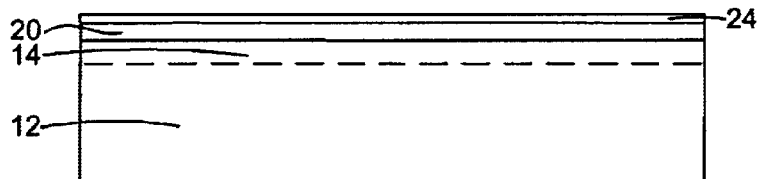
FIG. 2 is a schematic cross-sectional view of a semiconductor substrate with the semiconductor device at an intermediate stage of manufacture in accordance with the present invention.

In the first step of the method of the present invention, shown in FIG. 6 as Step S52, the semiconductor substrate 12 is provided. The semiconductor substrate 12 is shown in FIG. 2, for example. The semiconductor substrate 12 may be any appropriately selected semiconductor substrate known in the art, as described above. The semiconductor substrate 12 may be subjected to implants to provide the active region 14 in the semiconductor substrate 12 as is known in the art. For instance, boron or indium may be implanted to form a p-type region or channel for an n-type device and phosphorous or arsenic may be implanted to form an n-type region or channel for a p-type device. An exemplary range of concentration of these dopings is between $1\times10^{18}$ and $5\times10^{18}$ atoms/cm$^3$ for the p-type channel 30.

Next in Step S54, the gate dielectric layer 20 is formed on the semiconductor substrate 12. The gate dielectric layer 20 is formed of a dielectric material having a dielectric constant greater than the dielectric constant of $SiO_2$, for example, $Al_2O_3$. The gate dielectric layer 20 of $Al_2O_3$ may be deposited to a thickness between 10 and 100 angstroms (Å) (1 and 10 nm).

Next in Step S54, the thin polysilicon layer 24 is formed on the gate dielectric layer 20. The thin polysilicon layer 24 deposited on the gate dielectric layer 20 may be undoped. The thin polysilicon layer 24 may be deposited between about 10 and 200 angstroms (Å) (1 and 20 nm) thick. Following the deposition of the thin polysilicon layer 24, the thin polysilicon layer 24 may be polished back to a thickness of between about 10 and 50 angstroms (Å) (1 and 5 nm) thick.

Figure 3:
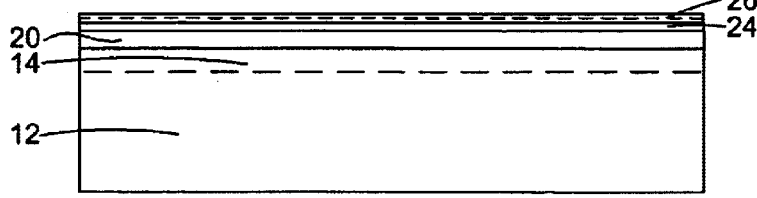
FIG. 3 is a schematic cross-sectional view of a semiconductor substrate with the semiconductor device at another intermediate stage of manufacture in accordance with the present invention.

Now referring to FIG. 3 and Step S56, the interface layer 26 (also referred to as a barrier layer) is formed on the thin polysilicon layer 24. The interface layer 26 is formed of a nitrogen rich material, for example, $Si_xN_y$. The interface layer 26 of $Si_xN_y$ may be deposited to a thickness between 10 and 50 angstroms (Å) (1 and 5 nm). In an alternative embodiment, the interface layer 26 may be of a $SiO_xN_y$ material, for example. In an alternative embodiment, the interface layer 26 may be of a $SiO_2$ material, for example.

In the exemplary embodiments, silicon nitride and silicon oxynitride are the nitrogen rich materials. When the nitride for the embodiment of $Si_xN_y$ is supplied, the nitride is in the form of ammonia gas, $NH_3$. When the nitride for the alternative embodiment of $SiO_xN_y$ is supplied, the nitride is in the form of nitrous oxide, $N_2O$. When the interface layer 26 is to be $Si_xN_y$, a flow of $NH_3$ is provided to the CVD apparatus. When a suitable thickness of $Si_xN_y$ has been deposited, the flow of the $NH_3$ gas is stopped. When the interface layer 26 is to be $SiO_xN_y$, a flow of $N_2O$ is provided to the CVD apparatus. When a suitable thickness of $SiO_xN_y$ has been deposited, the flow of the $N_2O$ is stopped.

In an alternative embodiment, this process of layer deposition may be continued until a suitable, selected number of layers of desired thickness have been deposited. In the exemplary embodiment, where more than one layer is deposited, it should be understood that the layers may be deposited in separate apparatuses. Depositing nitride using RTP techniques may also form the interface layer 26 of nitride.

In another embodiment, a Plasma Enhanced Chemical Vapor Deposition (PECVD) process is performed to form the interface layer 26 of $Si_xN_y$. A nitrogen ($N_2$) plasma treatment is conducted. A flow of $N_2$ gas of between about 1000 to about 9000 standard cubic centimeters per minute (sccm) is established to achieve a chamber pressure of 3.5 Torr. An RF power is turned on a power between about 50 W to about 500 W. After a suitable thickness of $Si_xN_y$ has been deposited, the flow of the gas is stopped.

In another embodiment, the PECVD process is performed with a $NH_3$ plasma treatment. A flow of $NH_3$ gas of between about 500 to about 2000 sccm is established to achieve a chamber pressure of 3.5 Torr. The RF power is turned on to a power between about 100 W to about 1000 W. After a suitable thickness of $Si_xN_y$ has been deposited, the flow of the gas is stopped.

In yet another embodiment, a HDP process is performed with a $N_2$ plasma treatment. A flow of $N_2$ gas of between about 1000 to about 3000 sccm is established to achieve a stable chamber pressure. A bias power is turned on to a power of about 2000 W. A source power is turned on to a power of about 2500 W. After a suitable thickness of $Si_xN_y$ has been deposited, the flow of the gas is stopped.

In still another embodiment, the HDP process is performed with a $NH_3$ plasma treatment. A flow of $NH_3$ gas of between about 1000 to about 2000 sccm is established to achieve a stable chamber of pressure. The bias power is turned on to a power of between about 2000 W to about 4000 W. A source power is turned on to a power of about 1500 W to about 3000 W. After a suitable thickness of $Si_xN_y$ has been deposited, the flow of the gas is stopped.

Figure 4:
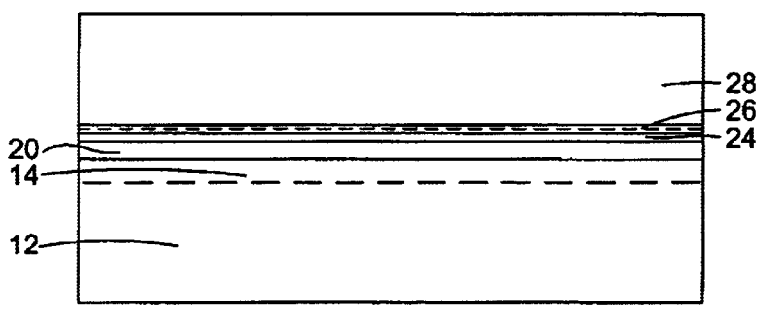
FIG. 4 is a schematic cross-sectional view of a semiconductor substrate with the semiconductor device at another intermediate stage of manufacture in accordance with the present invention.

Next in Step S58, the gate electrode layer 28 is formed on the interface layer 26 as shown in FIG. 4. Initially, an undoped layer of polysilicon may be deposited on the interface layer 26. The polysilicon gate electrode layer 28 may be deposited to between about 300 and 1500 angstroms (Å) (30 and 150 nm) thick. Following the deposition of the polysilicon gate electrode layer 28, it may be polished back to a thickness of between 800 and 1200 angstroms (Å) (80 and 120 nm) thick.

Figure 5:
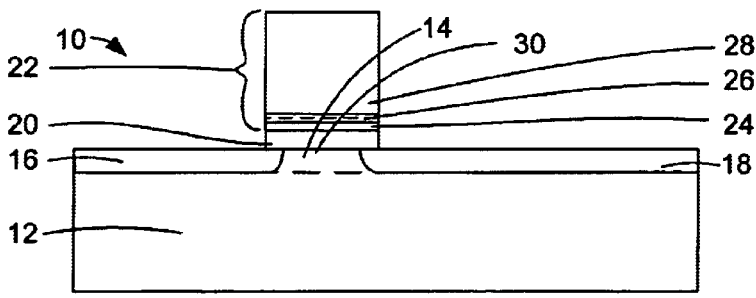
FIG. 5 is a schematic cross-sectional view of a semiconductor substrate with the semiconductor device at another intermediate stage of manufacture in accordance with the present invention.
Figure 6:
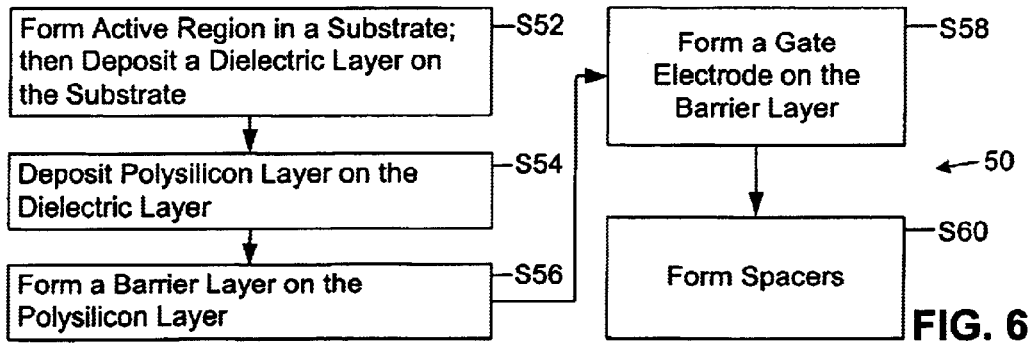
FIG. 6 is a schematic flow diagram showing the basic steps in a process of making a semiconductor device in accordance with the present invention.

Next, the polysilicon gate electrode layer 28 is patterned and etched to form the vertical stack shown in FIG. 5. The vertical stack includes the gate dielectric 20, the thin polysilicon layer 24, the interface layer 26 and the gate electrode 28. Following the formation of the vertical stack, an implantation step may be done at this time to implant the polysilicon of the gate electrode 28. Alternatively, the polysilicon gate electrode layer 28 may be N+ predoped, for example.

Next, the semiconductor substrate 12 may be subjected to implants to produce the source 16 and drain 18. The source 16 and the drain 18 may be formed by a main perpendicular implant. The main perpendicular implant is a relatively high energy, high concentration implant which is capable of producing the source 16 and the drain 18. Either boron, arsenic, or phosphorous may be used alone or in any combination as the dopant atoms. An exemplary range of implant dose of the perpendicular implant is between $1 \times 10^{15}$ and $2 \times 10^{15}$ atoms/cm². An exemplary range of concentration of these dopings is between $1 \times 10^{20}$ and $2 \times 10^{20}$ atoms/cm³ for the source 16 and the drain 18. The dopants may be selected from other dopant materials known in the art.

Although the source 16 and the drain 18 are shown as main implantation regions, it should be understood that extension implantation may be done in order to form extension regions as is known in the art. It should be understood that the formation of the source 16 and the drain 18 may take place before the formation of the gate electrode 28.

Subsequently, connections such as word lines may be formed using conventional techniques in order to establish electrical connections between the semiconductor device and other nodes (such as an I/O pad or Vss), the source 16 or the drain 18 of the device, as well as, a power supply or a ground, if desired. The formation of the connections is not shown.

Next in Step S60, the spacer layer 32 is formed on the gate electrode 28, the sidewalls of the interface layer 26, the sidewalls of the gate dielectric 20 and the surface of the semiconductor substrate 12 (not shown). The spacer layer 32 is formed of a dielectric material having a dielectric constant equal to or greater than the dielectric constant of the gate dielectric 20. The spacer layer 32 may be formed by a technique described above. In an exemplary embodiment, the spacer layer 32 is of $Al_2O_3$. The spacer layer 32 may have a thickness of between 200 and 400 angstroms (Å) (20 and 40 nm).

Next, the spacer layer 32 is anisotropically etched with a suitable etchant. The spacer layer 32 is etched down to expose the top of the gate electrode 28 and the lateral surface of the semiconductor substrate 12, leaving the spacers 32 shown in FIG. 1. The spacers 32 may extend from the surface of the semiconductor substrate 12 to a height of between 800 and 1200 angstroms (Å) (80 and 120 nm).

After the formation of the spacers 32, the semiconductor device 10 is subjected to rapid thermal annealing (RTA). Exemplary RTA may be performed for between 5 and 15 seconds at a temperature of 1020–1050° C.

The stacked polysilicon layer 22 inhibits the boron diffusion and/or penetration of the high-K gate dielectric and/or the semiconductor substrate 12 during the processing of the semiconductor device 10. Thus, the stacked polysilicon layer 22 preserves the high-K properties of the high-K dielectrics in semiconductor devices. Therefore, the present invention enables further device scaling without adverse impact on device performance.

Although particular embodiments of the invention have been described in detail, it is understood that the invention is not limited correspondingly in scope, but includes all changes, modifications and equivalents coming within the spirit and terms of the claims appended hereto. Additionally, although the flow diagram 50 of FIG. 6 shows a specific procedural order, it is understood that the procedural order may differ from that which is depicted. For example, the procedural order of two or more blocks may be reordered relative to the order shown. Also, two or more blocks shown in succession in FIG. 6 may be executed concurrently or with partial concurrence.

What is claimed is:

1. A semiconductor device formed on a semiconductor substrate having an active region, the semiconductor device comprising:
    a stacked polysilicon layer formed on a dielectric layer, the dielectric layer is disposed over the semiconductor substrate and
    the stacked polysilicon layer includes:
        a polysilicon layer disposed directly on the dielectric layer;
        an interface layer disposed on the polysilicon layer, the interface layer is one or more of an oxide material or a nitrogen rich material; and
        a gate electrode disposed directly on the interface layer; and
    wherein the stacked polysilicon layer inhibits the diffusion of boron in the dielectric layer and the penetration of boron into the dielectric layer and the semiconductor substrate,
    wherein a thickness of the polysilicon layer is less than a thickness of the gate electrode, and
    wherein the dielectric layer has a relative permittivity equal to or greater than that of aluminum-dioxide ($Al_2O_3$).

2. The semiconductor device according to claim 1, wherein the dielectric layer material is one or more of $Al_2O_3$, $HfO_2$, $ZrO_2$, $Ta_2O_5$, $BaTiO_3$, $TiO_2$, $CeO_2$, BST ($Ba_{1-x}Sr_xO_3$), PZN ($PbZn_xNb_{1-x}O_3$) and PST ($PbSc_xTa_{1-x}O_3$).

3. The semiconductor device according to claim 1, wherein the polysilicon layer is undoped.

4. The semiconductor device according to claim 1, wherein the semiconductor device is either a transistor or a memory cell,
    in the case of the transistor, the polysilicon layer of the stacked polysilicon layer is formed on a gate dielectric of the transistor,
    in the case of the memory cell,
    if a SONOS memory cell, the polysilicon layer of the stacked polysilicon layer is formed on a high-k layer of the SONOS memory cell,
    if a floating gate memory cell, the polysilicon layer of the stacked polysilicon layer is formed on a high-k layer of the floating gate memory cell.

5. The semiconductor device according to claim 1, wherein the dielectric layer is disposed directly on the semiconductor substrate.

6. The semiconductor device according to claim 1, wherein the thickness of the polysilicon layer is between about 10 angstroms and about 200 angstroms.

7. The semiconductor device according to claim 1, wherein the interface layer is a nitrogen rich material.

8. The semiconductor device according to claim 7, wherein the nitrogen rich material is one or more of $Si_xN_y$ and $SiO_xN_y$.

9. The semiconductor device according to claim 8, wherein the interface layer is $Si_xN_y$.

10. The semiconductor device according to claim 8, wherein the interface layer is $Si_xN_y$.

11. The semiconductor device according to claim 9, wherein the interface layer is a multiple layer interface including a $Si_xN_y$ layer and a $SiO_xN_y$ layer.

12. A semiconductor device formed on a semiconductor substrate having an active region, the semiconductor device comprising:
    a gate dielectric layer disposed on the semiconductor substrate;
    a polysilicon layer disposed directly on the gate dielectric layer;
    an interface layer disposed on the polysilicon layer, the interface layer is one or more of an oxide material or a nitrogen rich material; and
    a gate electrode formed directly on the interface layer and defining a channel interposed between a source and a drain formed within the active region of the semiconductor substrate,
    wherein the interface layer inhibits the boron diffusion and penetration of the gate dielectric layer,
    wherein a thickness of the polysilicon layer is less than a thickness of the gate electrode, and
    wherein the gate dielectric layer has a relative permittivity equal to or greater than that of aluminum-dioxide ($Al_2O_3$).

13. The semiconductor device according to claim 12, wherein the interface layer inhibits boron diffusion and penetration during an annealing step.

14. The semiconductor device according to claim 12, wherein the interface layer is $Si_xN_y$.

15. The semiconductor device according to claim 12, wherein the semiconductor device is either a transistor or a memory cell,
    in the case of the transistor, the polysilicon layer of the stacked polysilicon layer is formed on a gate dielectric of the transistor,
    in the case of the memory cell,
    if a SONOS memory cell, the polysilicon layer of the stacked polysilicon layer is formed on a high-k layer of the SONOS memory cell,
    if a floating gate memory cell, the polysilicon layer of the stacked polysilicon layer is formed on a high-k layer of the floating gate memory cell.

16. The semiconductor device according to claim 12, wherein the gate dielectric layer is disposed directly on the semiconductor substrate.

17. The semiconductor device according to claim 12, wherein the thickness of the polysilicon layer is between about 10 angstroms and about 200 angstroms.

18. The semiconductor device according to claim 12, wherein the interface layer is $SiO_xN_y$.

19. The semiconductor device according to claim 18, wherein the interface layer is a multiple layer interface including a $Si_xN_y$ layer and a $SiO_xN_y$ layer.

* * * * *

UNITED STATES PATENT AND TRADEMARK OFFICE
CERTIFICATE OF CORRECTION

PATENT NO. : 6,762,454 B1  
APPLICATION NO. : 10/118363  
DATED : July 13, 2004  
INVENTOR(S) : Ibok et al.

Page 1 of 1

It is certified that error appears in the above-identified patent and that said Letters Patent is hereby corrected as shown below:

Cover sheet, right column, replace "Renner, Otto, Boissele & Sklar, LLP" with --Renner, Otto, Boisselle & Sklar, LLP--.
Column 1, line 27, replace "modem" with --modern--.
Column 4, line 23, replace "intention" with --invention--.
Column 6, line 33, replace "$Si_xN_y$" with --$Si_xN_y$,--.
Column 6, line 40, replace "device" with --device,--.
Column 7, TABLE 1, row 6, replace "lanthanum" with --lanthanum oxide, $La_2O_3$ --.
Column 7, TABLE 1, remove row 7.
Claim 10, line 2, replace "$Si_xN_y$" with --$SiO_xN_y$--.

Signed and Sealed this

Twenty-ninth Day of May, 2007

JON W. DUDAS  
*Director of the United States Patent and Trademark Office*